United States Patent
Takanami

[19]

[11] Patent Number: 5,876,556
[45] Date of Patent: Mar. 2, 1999

[54] DIE-BONDING DEVICE

[75] Inventor: Yasuo Takanami, Kasuga, Japan

[73] Assignee: Matsushita Electric Industrial Co., Ltd., Osaka, Japan

[21] Appl. No.: 850,016

[22] Filed: May 1, 1997

[30] Foreign Application Priority Data

May 7, 1996 [JP] Japan ..................................... 8-112499

[51] Int. Cl.⁶ .................................................. B32B 31/00
[52] U.S. Cl. ............................. 156/556; 29/831; 414/752
[58] Field of Search .................................. 156/556, 572, 156/538; 414/591, 627, 752, 783; 29/831; 269/21

[56] References Cited

U.S. PATENT DOCUMENTS

| | | | |
|---|---|---|---|
| 3,762,015 | 10/1973 | Radobenko | 29/203 |
| 4,346,514 | 8/1982 | Makizawa et al. | 414/752 X |
| 4,763,941 | 8/1988 | Sniderman | 414/627 X |
| 4,960,485 | 10/1990 | Ichinose et al. | 156/556 |

*Primary Examiner*—James Engel
*Attorney, Agent, or Firm*—Stevens, Davis, Miller & Mosher, L.L.P.

[57] ABSTRACT

Head part carrying a nozzle for picking-up a chip is moved up and down with the use of a can and cam follower during movement of the head part between a wafer in a chip supply part and a substrate in a positioning part so as to shorten a stroke for the up and down movement of the nozzle for picking up a chip from a wafer in the chip supply part, and mounting the chip on the substrate, and a load during the movement of the nozzle is reduced thereby it is possible to enhance the speed at which the head part is moved between the wafer and the substrate so as to shorten the time tact and to enhance the working efficiency.

6 Claims, 6 Drawing Sheets

DIE-BONDING DEVICE

BACKGROUND OF THE INVENTION

1. FIELD OF THE INVENTION

The present invention relates to a die-bonding device for picking up a chip from a wafer set on a supply part of an electric part mounting machine and shifting and mounting the same onto a lead frame or a printed circuit board.

2. RELATED ART

In a die-bonding device, a nozzle picks up a chip under vacuum suction from a wafer set on a supply part of an electric part mounting machine, and then shifts and mounts the same onto a lead frame or a printed circuit board.

Explanation will be made of the above-mentioned die-bonding device with reference to FIG. 7 which is a side view. A lead frame 1 is held on a guide part 2 in an electric part mounting machine, and a wafer 3 is held on a holder 4 which is carried on a movable table device 7 composed of an X-axis table 5 and a Y-axis table 6. A head part 8 carrying thereon a nozzle 9 for picking up a chip P on the wafer 3 at its lower end under vacuum suction is adapted to be reciprocated between the wafer 3 and the lead frame 1 by a drive means (which is not shown).

The head part 8 is reciprocated between two positions, that is, a position indicated by a solid line and a position indicated by a chain line. When the head is located at the stop position indicated by the chain line, the movable table device 7 is operated so as to move the wafer 3 in the X-axial and Y-axial directions, relative to the nozzle 9 which therefore can pick up a desired chip P. With this arrangement, a height difference D is ensured between the wafer 3 and the guide part 2 in order to prevent the wafer 3 from interfering with the guide part 2 when the holder 4 for holding the wafer 3 is displaced toward the guide part 2, and the wafer 3 is located below the guide part 2.

In a condition in which the head part 8 comes to and stops at a position right above the wafer 3, as indicated by the chain line, a vertically moving means such as a linear motor incorporated in the head part 8, is driven, and accordingly, the nozzle 9 moves up and down so as to pick up a desired chip P from the wafer 3 under vacuum suction. When the head part 8 is shifted to and is stopped at the position indicated by the solid line above the lead frame 1, the nozzle 9 similarly moves up and down so as to mount the chip P onto the lead frame 1. The above-mentioned operational steps are repeated while the lead frame 1 is fed pitch by pitch on the guide part 2 so as to mount chips P picked up from the wafer 3, successively onto the lead frame 1.

Referring to FIG. 7, since the height difference D is ensured, a vertical stroke Sa of the nozzle 9 during pick-up of a chip P from the wafer 3, is longer than a vertical stroke Sb of the nozzle 9 during mounting of the chip P onto the lead frame 1. Accordingly, the vertical motion of the nozzle 9 for picking up a chip P from the wafer 3 requires a long time, and accordingly, there has been a problem such that a time tact becomes longer, correspondingly, and therefore, the working efficiency is low.

Further, the vertically moving means (such as a linear motor) for the nozzle 9, provided in the head part 8, is heavy in its weight which exerts a relatively large load when the head part 8 moves between the wafer 3 and the lead frame 1, and accordingly, an increase in shift speed of the head part 3 is limited.

SUMMARY OF THE INVENTION

The present invention is devised in order to eliminate the above-mentioned problems, and accordingly, an object of the present invention is to provide a die-bonding device or a die-bonding method in which a vertical stroke of a nozzle during pick-up of a chip from a wafer in a chip supply part can be shortened so as to shorten the tact time.

A further object of the present invention is to provide a die-bonding device in which a load exerted to a head part is reduced so as to enable the head part to move at a high speed between a chip supply part and a substrate, thereby it is possible to enhance the working efficiency.

According to a first aspect of the present invention, there is provided a die-bonding device comprising a positioning part for positioning a substrate, a chip supply part arranged below the substrate set on the positioning part with a height difference therebetween, a head part elevatably carrying thereon a nozzle for sucking up a chip, a moving means for moving the head part between the positioning part and the chip supply part, a cam incorporating a cam curving line having a downward grade from the positioning part to the chip supply part, a cam follower integrally incorporated with a nozzle and adapted to move along the cam curve line so as to move the nozzle up and down along the cam curve line, a vertically moving means for moving the cam up and down so as to move the nozzle up and down above the positioning part or the chip supply part.

According to a second aspect of the present invention, there is provided a die-bonding device in which a drive part in the vertically moving means for moving the cam up and down, is provided, being separated from the head part, on the stationary bed side, and accordingly, no load is exerted by the drive part during movement of the head part between the chip supply part and the substrate positioning part.

According to a third aspect of the present invention, there is provided a die-bonding method comprising the steps of positioning a substrate in a positioning part, moving a nozzle to a position above a chip supply part while lowering the nozzle, further lowering and raising the nozzle so as to pick up a chip to the nozzle under vacuum suction, moving the nozzle from the chip supply part to a position above the positioning part while elevating the nozzle, and lowering and raising the nozzle so as to bond the chip on the substrate.

In the first aspect of the present invention, the head part lowers along the cam curve line when the nozzle is moved to the chip supply part, and accordingly, a descent stroke of the nozzle can be gained during this period so that the vertical stroke of the nozzle for picking up a chip in the chip supply part can be greatly shortened, thereby it is possible to pick up a chip in a short stroke at a high speed.

Further, in the second aspect of the present invention, a load during movement of the head part can be remarkably reduced, and accordingly, the head part can be moved at a high speed between the chip supply part and the substrate.

Further, in the third aspect of the present invention, the stroke of the nozzle during pick-up of a chip in the chip supply part can be shortened so as to promote the mounting of the chip on the substrate.

Explanation will be hereinbelow made of an embodiment of the present invention with reference to the drawing in which:

DESCRIPTION OF PREFERRED EMBODIMENTS OF THE INVENTION

Figure 1:
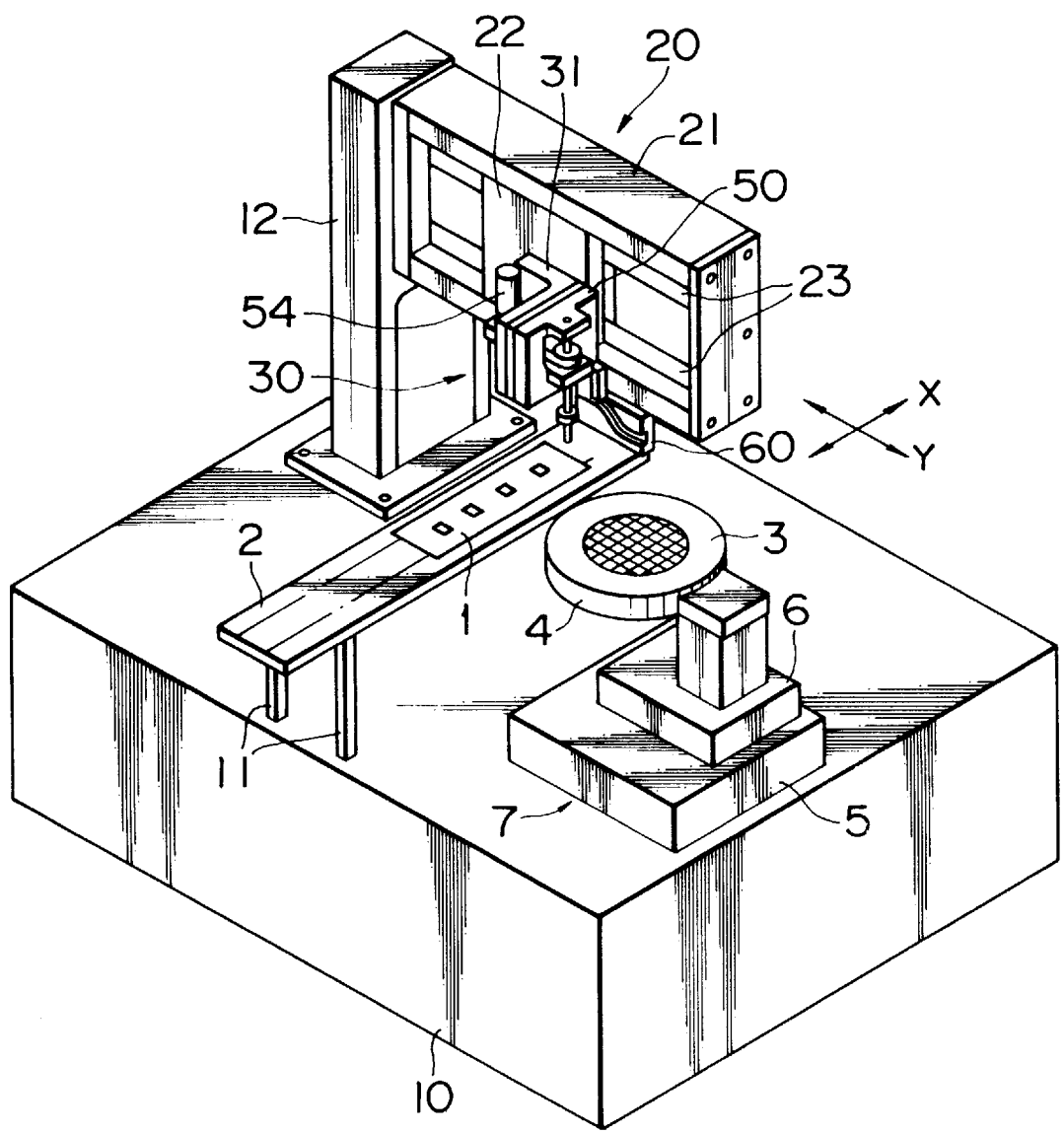
FIG. 1 is a perspective view illustrating a die-bonding device in an embodiment form of the present invention.

At first, the entire structure of a die-bonding device in an embodiment of the present invention will be explained with reference FIGS. 1 to 6. It is noted that like reference numerals are used to denote like parts to those in the related example shown in FIG. 7. Referring to FIG. 1, a guide part 2 for a lead frame 1 is supported on poles 11 which are planted on the top surface of a base 10. The lead frame 1 is fed pitch by pitch in the longitudinal direction (X-axial direction) of the guide part 2, and is positioned at a predetermined position. A movable table assembly 7 composed of an X-axial table 5 and a Y-axial table 6 is arranged laterally of the guide part 2, and is attached in the upper part thereof with a holder 4 for holding a wafer 3. That is, the wafer 3, the holder 4 and the movable table 7 constitute a chip supply part.

Figure 4:
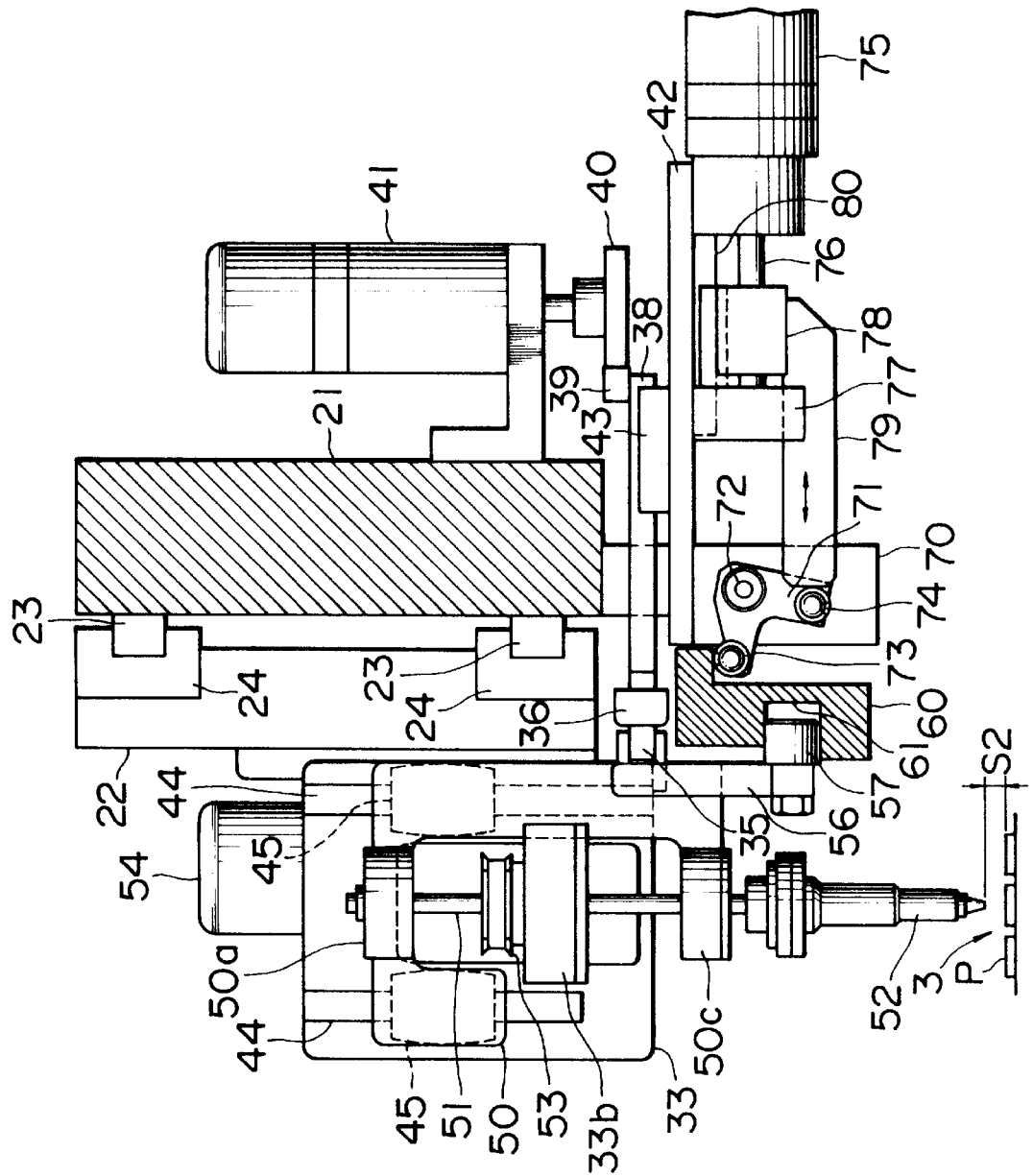
FIG. 4 is a side view illustrating the die-bonding device shown in FIG. 1.

A pillar 12 is planted on the base 10 in the rear part of the latter, and a linear motor part 20 is supported cantilever-like from one rear corner part of the pillar 12. This rear motor part 20 which will be hereinbelow detailed, serves as a moving means for moving a head part 30 between the wafer 3 and the lead frame 1, and is composed of a stator 21 as a drive source, and a movable panel 22. Referring to FIG. 4, two upper and lower horizontal guide rails 23 are provided at the front surface of the stator 21. Further, a slider 24 is provided at the rear surface of the movable panel 22, being slidably fitted on the guide rails 23. Accordingly, when a coil (which is not shown) located in the stator 21 is excited so as to generate a magnetic force for moving the movable panel 22 slidably along the guide rails 23 in a horizontal direction (Y-axial direction). It is noted that a feed screw mechanism composed of a ball screw, a nut and a motor may be used, instead of the linear motor part 20.

Figure 2:
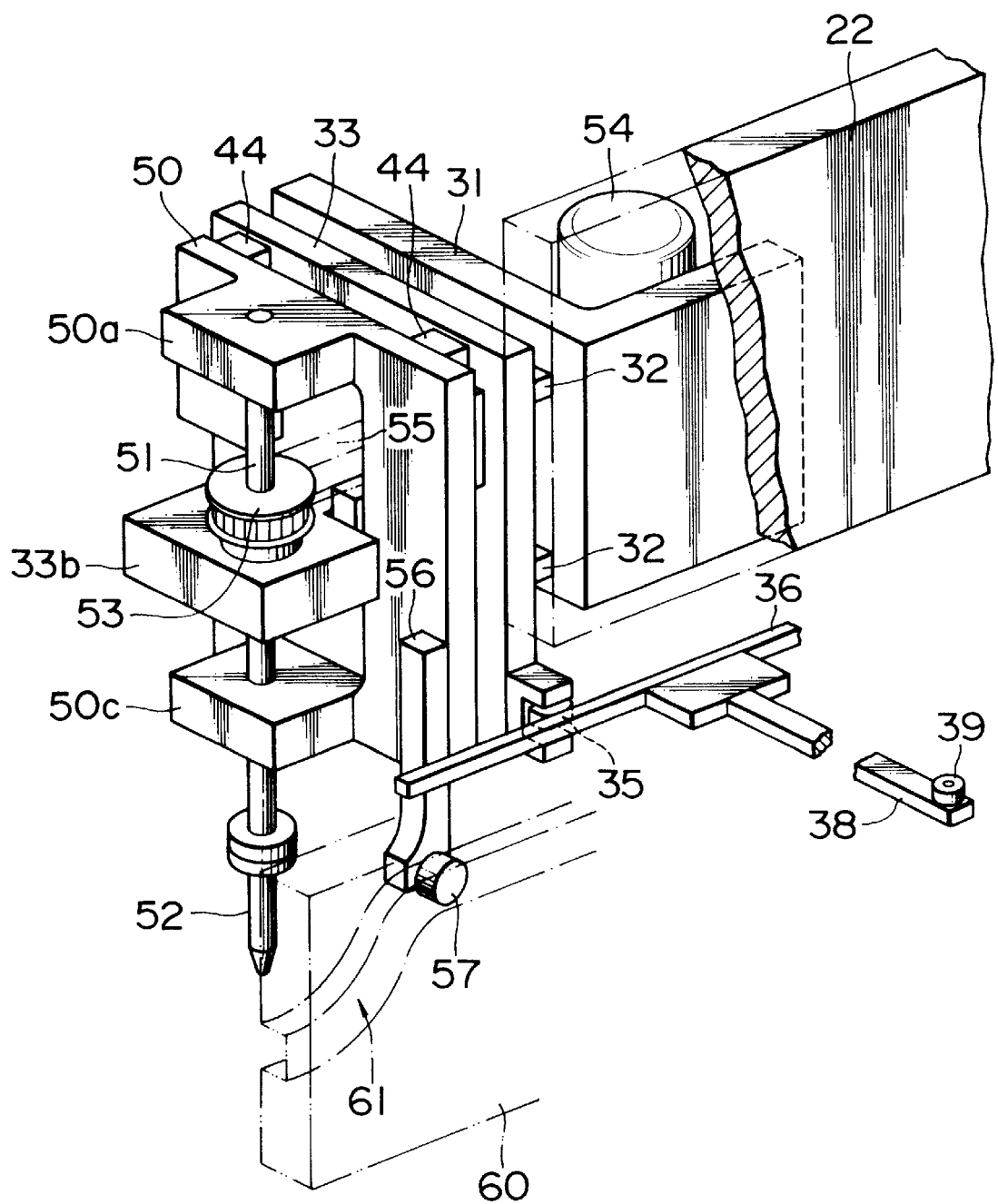
FIG. 2 is an enlarged perspective view illustrating an essential part of the die-bonding device shown in FIG. 1.
Figure 3:
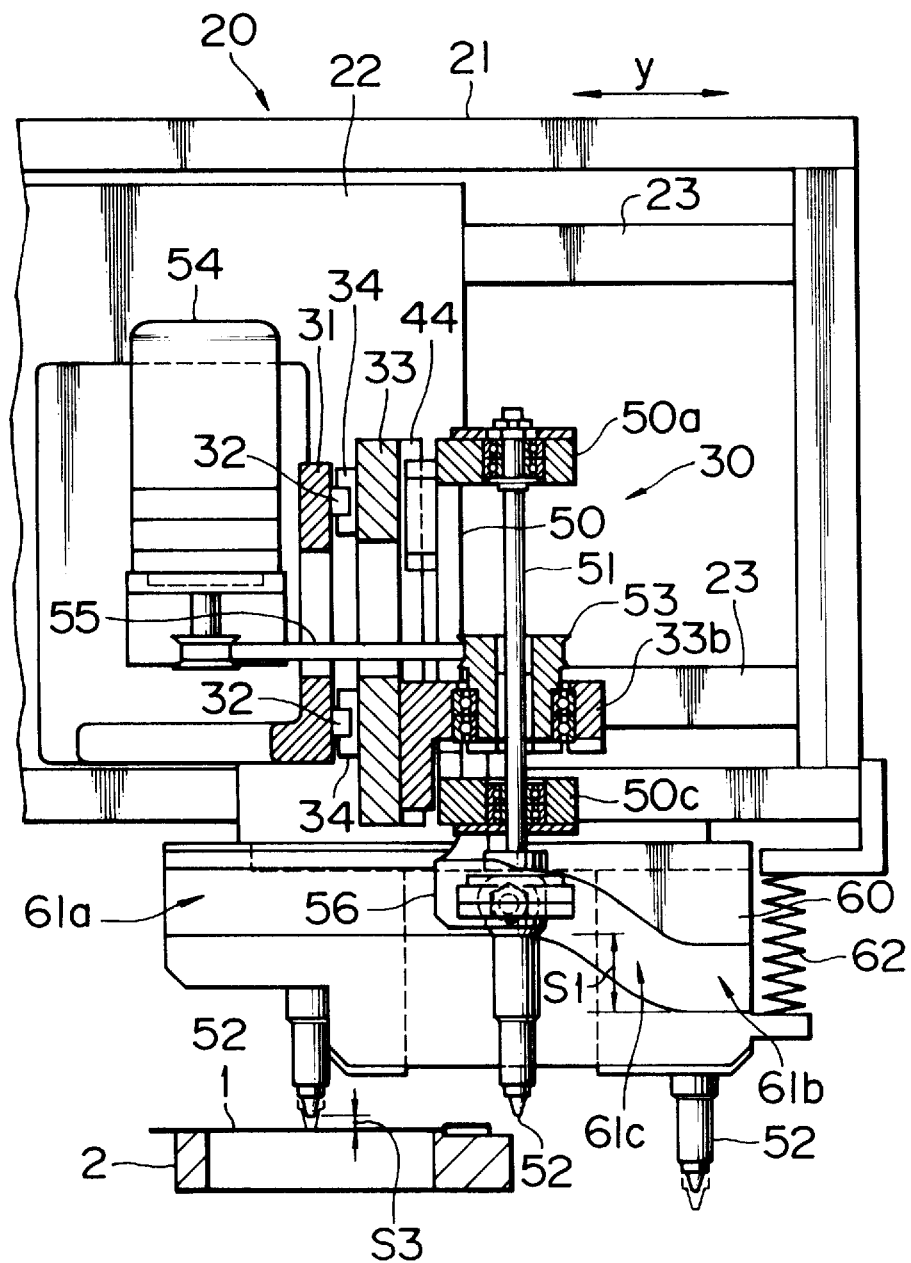
FIG. 3 is a front view illustrating the die-bonding device shown in FIG. 1.
Figure 5:
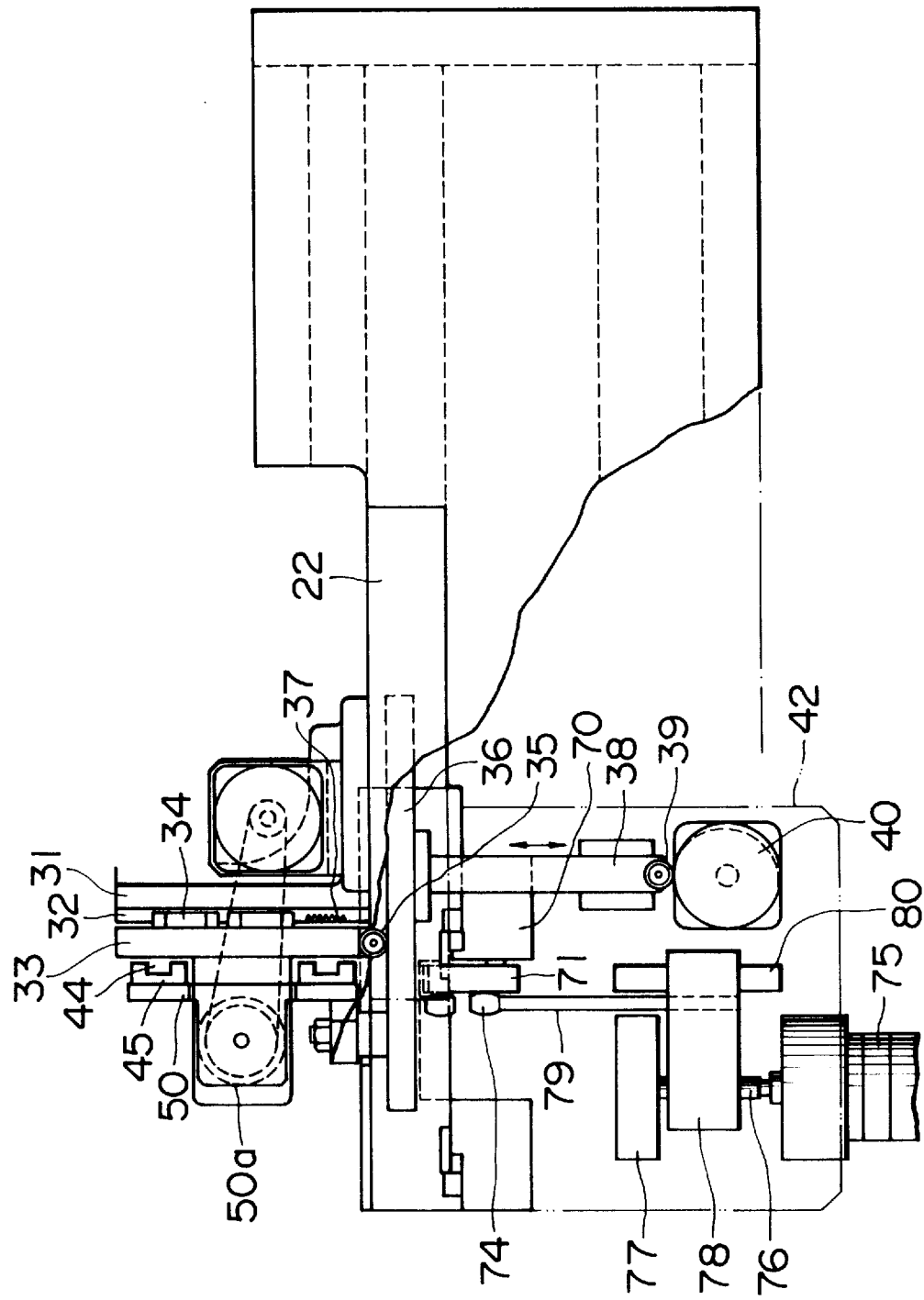
FIG. 5 is a plan view illustrating the die-bonding device shown in FIG. 1.

Referring to FIG. 1, the head part 30 which is provided at the front surface of the movable panel 22, being integrally incorporated thereto, is adapted to be moved in the Y-axial direction between the lead-frame 1 and the wafer 3 together with the movable panel 22. Explanation will be made of a detailed structure of the head part 30. Referring to FIGS. 2 and 3, a hooked bracket 31 is attached to the front surface of the movable panel 22. Two upper and lower guide rails 32 are mounted to the front surface of the bracket 31, being extended in a horizontal direction (X-axial direction). A plate 33 is provided also to the front surface of the bracket 31. Referring to FIG. 5, a slider 34 is provided at the rear surface of the bracket 31, being slidably fitted on the guide rails 32. Accordingly, the plate 33 is movable in the horizontal direction (X-axial direction) along the guide rails 32.

Referring to FIG. 2, a roller 35 is held by a fork part formed on the lower part of one side surface of the plate 33 so as to be rotatable in a horizontal direction. The roller 35 is made into contact with a transversely long guide 36. A spring 37 shown in FIG. 5 urges the plate 33 toward the guide 36. As best shown in FIGS. 2 and 5, the guide 36 is coupled to the front end part of a shaft 38 having its rear end part to which a roller 39 is journalled. The roller 39 abuts against a cam 40. Referring to FIG. 4, a guide 43 for guiding the shaft 38 in the longitudinal direction thereof is provided on a stationary bed 42. When the cam 40 is rotated during operation of a motor 41, the shaft 38 is slightly reciprocated in the X-axial direction. Accordingly, the plate 33 is reciprocated also in the X-axial direction by means of the guide 36 and the roller 35. This reciprocation causes a nozzle to carry out scrubbing motion in the X-axial direction.

As shown in FIG. 2, an attachment member 50 is mounted to the front part of the plate 33. The attachment member 50 is mounted to the plate 33 through the intermediary of vertical guide rails 44, 44 so as to be vertically movable (refer to FIG. 3). Referring to FIGS. 2 and 3, bearing parts 50a, 50c are projected from the attachment member 50, and are held therein with a nozzle shaft 51 in an upright posture. A nozzle 52 for picking up a chip under vacuum suction is provided to the lower end part of the nozzle shaft 51 onto which a timing pulley 53 is fitted. This timing pulley 53 is rotatably journalled by a bearing part 33b fixed to the front surface of the plate 33. Spline grooves (which are not shown) are formed in the peripheral surface of the nozzle shaft 33 in the longitudinal direction of the shaft 33, and accordingly, the nozzle shaft 51 is supported by a bearing incorporated in the timing pulley so as to be slidable only in the vertical direction. A motor 54 for angular rotation is mounted on the rear side of the bracket 31. The rotation of the motor 54 is transmitted to the nozzle shaft 51 through a timing belt 55 and a timing pulley 53 and accordingly, the nozzle shaft 51 is angularly rotated around its center axis. Thus, a chip picked up by the lower end part of the nozzle 52 under vacuum suction is horizontally turned.

Referring to FIGS. 2 to 4, a bar 56 is mounted to the lower part of the side surface of the attachment member 50. A cam follower 57 is journalled to the lower part of the bar 56. A panel-like cam 60 which is long in the Y-axial direction, is formed in the front surface thereof with and a cam groove 61 having a predetermined cam curve line, extending in the Y-axial direction. Referring to FIG. 3, this cam groove 61 consists of a first horizontal part 61a located right above the lead frame 1, a second horizontal part 61b right above the wafer 3, and an inclined part 61c extending therebetween and having a grade downward toward the wafer 3. The cam follower 57 journalled to the attachment member 50 is fitted in the cam groove 61, and the cam 60 is resiliently supported by a spring 62. Referring to FIG. 3, when the linear motor part 20 is driven, the movable panel 22 is moved in the Y-axial direction along the guide rails 23, and accordingly, the cam follower 57 is moved in the same direction while rolling in the cam groove 61. Then, the cam follower 61 is moved in the inclined part 61c. Thus, the attachment member 50, the nozzle shaft 51 held to the attachment member 50 and the nozzle 52 are moved up and down.

Next, referring to FIGS. 4 and 5, explanation will be made of a vertically moving means for moving the cam 60 up and down. A block 70 is provided to the rear surface of the cam 60. A hook-like lever 71 is journalled to the block 70 by means of a pin 72 so as to be vertically rotatable. Rollers 73, 74 are journalled to opposite end parts of the lever 71, and the roller 73 abuts against the lower surface of a protrusion 60a at the rear surface of the cam 60. The protrusion 60a is made into press contact with the roller 73 under the resilient force of the above-mentioned spring 62 (FIG. 3).

A stationary bed 42 which is provided to the rear surface of the cam 60, is fixed to the lower part of the stator 21. The block 70, a motor 75 and the like are attached to the lower surface of the stationary bed 42. The motor 75 is adapted to rotate a feed screw 76 which is long in the X-axial direction. The front end part of the feed screw 76 is journalled by a bearing 77. A nut 78 is fitted on the feed screw 76, and is coupled thereto with a rod 79 extending forward and having its front end part which is made into press contact with the roller 74 of the lever 71. The nut 78 is fed along a guide rail 80.

Accordingly, when the motor 75 is driven so as to rotate the feed screw 76, the nut 78 is moved along the feed screw 76. Thus, the rod 79 is moved in the X-axial direction so as to press the roller 74 of the lever 71 at the rear surface of the latter. Then, the lever 71 is turned about the pin 72, and accordingly, the cam 60 making contact with the roller 73 through the intermediary of the protrusion 60a is moved up and down. The attachment member 50 is coupled to the cam 60 through the bar 56 and the roller 57, and accordingly, when the cam 60 is moved up and down, the attachment member 50, the nozzle shaft 51 and the nozzle 52 which are held by the attachment member 50 are also moved up and down.

As mentioned above, the nozzle 52 is moved up and down at first by moving the cam follower 57 along the inclined part 61c of the cam groove 61, and at second by moving the cam 60 up and down through the d rive of the motor 75. By sufficiently enhancing the machining accuracy of the cam groove 61, the length of the stroke of the nozzle 52 can be always ensured precisely by the cam groove 61. Further, by digitally controlling the drive of the motor 75, the stroke of the nozzle 52 can be precisely controlled.

Figure 6:
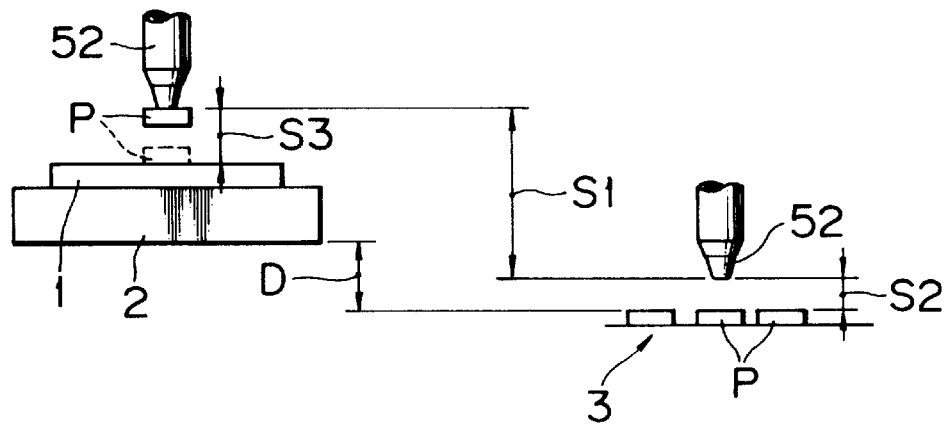
FIG. 6 is an explanatory view showing a stroke of a nozzle.

Referring to FIG. 6 which is explanatory view showing the stroke of the nozzle 52, a height difference D is ensured between the guide part 2 on which the lead frame 1 is set, and the upper surface of a chip P (pick-up level of the chip P) incorporated in the wafer 3 which is located at a position below the lead frame 1. The necessity of the height difference D has been already been explained with reference to FIG. 7.

Figure 7:
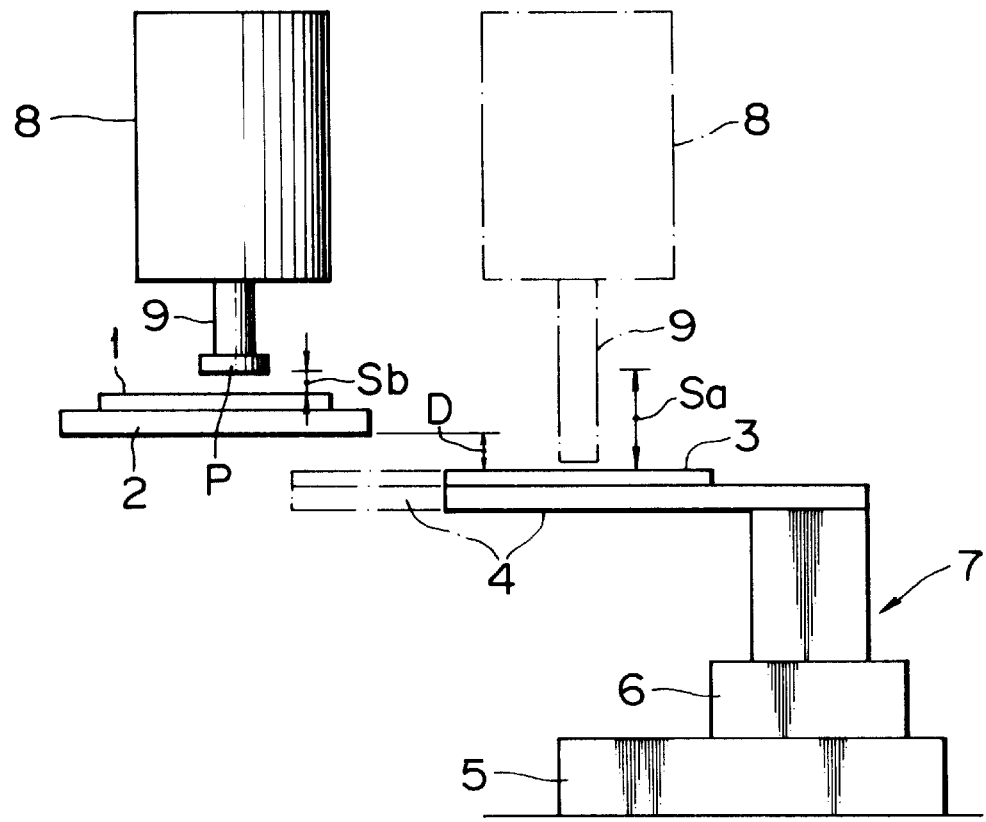
FIG. 7 is a side view illustrating a die-bonding device for comparison with the die-bonding device according to the present invention.

In order to absorb this height difference D, a stroke S1 can be gained by the inclined part 61c of the cam groove 61. When the chip P is picked up from the wafer 3, the motor 75 is driven to move the c am 60 up and down so as to gain a stroke S2, and further, when the chip P is mounted onto the lead frame 1, the motor 75 is again driven to move the cam 60 up and down so as to gain the stroke S3. It is noted that the stroke S1 is gained during the movement of the nozzle 52 between the wafer 3 and the lead frame 1, and accordingly, the time for gaining the stroke S1 is not additional but can be included in the time of the displacement between the waver 3 and the lead frame 1. Thus, only the times for gaining the stroke S2 and the stroke S3 becomes additional. That is, since only the stroke S2 is required for picking up the chip P from the wafer 3, and since this stroke S2 is extremely shorter than the stroke Sa which has been required for the conventional structure as shown in FIG. 7, the time for picking up the chip P can be greatly shortened. Further, the strokes S1, S2, S3 can be precisely obtained as mentioned above. It is noted that the stroke of the nozzle 52 is different, depending upon the thickness of a chip P to be picked up, the degree of rotation of the motor 75 is adjusted in accordance with a thickness of a chip to be picked up.

Further, with the repetitions of the reciprocation of the nozzle 52 between the wafer 3 and the lead frame 1, chips P are picked up from the wafer 3 and are mounted on the lead frame 1. However, in this arrangement, the vertically moving means including the cam 60, the lever 70, the motor 75 the feed screw 76, the nut 76 and the like, for moving the nozzle 52 up and down, is integrally incorporated not to the head part 70, but to the stationary bed 42, and accordingly, no load is exerted to the reciprocation of the nozzle 52. That is, only components assembled to the bracket 31 and the attachment member 50 exert a load to the reciprocation of the nozzle 52 effected through the drive of the linear motor part 20. Accordingly, a less load is exerted to the linear motor part 50 which can therefore move the nozzle 52 at a high speed between the wafer 3 and the lead frame 1.

Next, explanation will be made of this die-bonding device which is composed as mentioned above as a whole. Referring to FIG. 1, the lead frame 1 having transferred on the guide part 20, is stopped and positioned at a predetermined position. Then, the linear motor part 20 is driven to slide the movable panel 2 along the front surface of the stator 21, being guided by the guide rails 23, and accordingly, the head part 30 is moved to a position above the wafer 3. At this time, as shown in FIG. 3, the cam follower 57 passes through the inclined part 61c of the cam groove 61 so that the nozzle 52 descends by the stroke S1 until it comes to the position above the wafer P. FIG. 4 shows this condition.

Referring to FIG. 4, the nut 78 is retracted rightward along the feed screw 76 when the motor 75 is normally rotated, and accordingly, the rod 79 is also retracted. Accordingly, the lever 71 is turned counter-clockwise by a load exerted by the protrusion 60a of the cam 60 which is lowered by a length corresponding to the stroke S2. Thus, the lower end part of the nozzle 52 comes to the upper surface of a chip P to be picked in the wafer 3, and accordingly, the chip P is picked up under vacuum suction. When the motor 7 is reversely rotated, the nut 78 is moved leftward along the feed screw 76 while the rod 79 is advanced so that its front end part pushes the roller 74 on the lever 71 which is therefore turned clockwise. As a result, the cam 60 is pushed up by a length corresponding to the stroke S2 so that the nozzle 52 is raised by a length corresponding to the stroke S2 for picking up the chip P.

Then, the linear motor part 30 is driven in the reverse direction, and accordingly, the movable plate 22 is moved leftward as viewed in FIG. 4. Accordingly, the nozzle 52 is moved to a position above the lead frame 1. During this period, the cam follower 57 passes through the inclined part 61c of the cam groove 61 so that the nozzle 52 is raised by the stroke S1. Next, the motor 52 is normally rotated so as to lower the cam 60, and accordingly, the chip P held by the lower end part of the nozzle 52 under vacuum suction is landed onto the read fame 1 (the chip P in this condition is indicated by a chain line in FIG. 6). At this time, the nozzle 52 is lowered by the stroke S3.

In this landing condition, when the motor 41 is rotated normally and reversely as shown in FIG. 4, the shaft 38 is reciprocated through the rotation of the cam 40 in its longitudinal direction (X-axial direction), and accordingly, the plate 33 and the attachment member 50 are reciprocated in the same direction so that the nozzle 52 carries out a slight scrubbing motion in the X-axial direction. Simultaneously, the linear motor part 20 is slightly driven, normally and reversely, the nozzle 52 carries out a slight scrubbing motion also in the Y-axial direction. With these scrubbing motions in the X- and Y-axial directions an adhesive applied over the lead frame 1 is made into contact with the entire rear surface of the chip P which can be therefore bonded surely to the lead frame 1. Next, after the vacuum suction for picking up the chip P is released, when the motor 75 is reversely rotated so as to raise the nozzle 52, the successive step motions are completed. With the repetitions of the above-mentioned operation while the lead frame 1 is fed pitch by pitch, chips P are successively mounted on the lead frame 1.

According to the present invention, since the nozzle is moved and lowered along the cam curve line during the movement of the nozzle from a substrate to the chip supply part, the up and down motion of the nozzle can become slight when a chip is picked up from the chip supply part. This is because of the up and down motion of the cam. Thus, it is possible to greatly shorten the stroke of the nozzle, that is, the time required for picking up a chip can be shortened. Thereby it is possible to mount the chip P onto the substrate at a high speed. Further, by precisely adjusting the strokes of the nozzle in accordance with a thickness of the chip, the pick-up of a chip in the chip supply part, and the mounting of the chip onto the substrate can be surely made.

Further, with the provision of the drive part in the vertically moving means for moving the cam up and down, on the stationary bed which is separated from the head part, the driven part does not exerted a load to the movement of the nozzle between the chip supply part and the positioning part for the substrate, and the nozzle is moved at a high speed between the chip supply part and the substrate. Thereby it is possible to mount a chip onto the substrate at a high speed.

What is claimed is:

1. A die-bonding device comprising:

a base;

a positioning part, provided on the base, for positioning a substrate at a first position;

a chip supply part for supplying a chip, the chip supply part being arranged on said base at a second position lower than the first position at which the substrate is positioned by the positioning part by a height difference;

a head part elevatably carrying a transfer element for picking up the chip;

a moving means for moving said head part between the positioning part and the chip supply part;

a cam having a cam curve line having a downward grade from said positioning part to said chip supply part;

a cam follower integrally incorporated with said transfer element for moving along the cam curve line so as to move said transfer element up and down; and a vertical movement causing means for moving said cam up and down so as to move said transfer element above said positioning part and said chip supply part.

2. A die-bonding device as set forth in claim 1, wherein said vertical movement causing moving means for moving said cam has a drive part which is integrally incorporated not with said head part but with said base so that said drive part does not exert a load during movement of said head part between the chip supply part and the positioning means.

3. A die-bonding device as set forth in claim 1, wherein the transfer element is a nozzle.

4. A bonding method comprising the steps of:

(a) positioning a substrate in a positioning part;

(b) moving a transfer element to a position above a chip supply part while guiding a cam follower incorporated with said transfer element along a cam so as to lower said transfer element;

(c) moving said cam follower up and down by vertical movement causing means in a vertical direction so as to move said transfer element up and down to pick up a chip;

(d) moving said transfer element from said chip supply part to a position above the positioning part while guiding said cam follower along said cam so as to raise said transfer element; and (e) moving said cam follower up and down by said vertical movement causing means in said vertical direction so as to move said transfer element up and down to bond the chip onto said substrate.

5. A bonding method as set forth in claim 4, wherein each of steps (c) and (e) comprises moving said cam in said vertical direction so as to move said cam follower and said nozzle.

6. A bonding method as set forth in claim 4, wherein the transfer element is a nozzle.

\* \* \* \* \*